US005739696A

United States Patent [19]
Herrmann et al.

[11] Patent Number: 5,739,696
[45] Date of Patent: Apr. 14, 1998

[54] PROBE AND APPARATUS FOR TESTING ELECTRONIC COMPONENTS

[76] Inventors: Jakob Herrmann, 3620 W. Elgin St., Chandler, Ariz. 85226; Josef Baumann, 40800 NW. Monarch La., Banks, Oreg. 97106

[21] Appl. No.: 694,930

[22] Filed: Aug. 8, 1996

[51] Int. Cl.$^6$ ..................................................... H01R 43/16
[52] U.S. Cl. ............................................................ 324/754
[58] Field of Search ................. 73/866.5; 324/754–759, 324/761, 762; 209/573, 574, 571

[56] References Cited

U.S. PATENT DOCUMENTS

| | | | |
|---|---|---|---|
| 4,414,506 | 11/1983 | Kelley | 324/754 |
| 4,423,373 | 12/1983 | LeCroy, Jr. | 324/754 |
| 4,747,479 | 5/1988 | Herrman | |
| 4,766,371 | 8/1988 | Moriya | |
| 4,818,382 | 4/1989 | Anderson et al. | |
| 4,820,972 | 4/1989 | Scott et al. | |
| 4,943,768 | 7/1990 | Niki et al. | |
| 4,973,903 | 11/1990 | Schemmel | 324/754 |
| 4,978,913 | 12/1990 | Hamuro et al. | |
| 4,993,957 | 2/1991 | Shino | 324/754 |
| 5,166,602 | 11/1992 | Byford et al. | |
| 5,214,375 | 5/1993 | Ikeuchi et al. | 324/754 |
| 5,457,882 | 10/1995 | Clarke et al. | 324/754 |
| 5,565,788 | 10/1996 | Burr et al. | 324/754 |
| 5,568,870 | 10/1996 | Utech | 209/573 |

*Primary Examiner*—Robert Raevis
*Attorney, Agent, or Firm*—Franklin Gubernick

[57] ABSTRACT

To facilitate the testing of small electronic components, an improved test probe is disclosed. The basic form of the probe comprises a support body made of at least one strip of circuit board material. A pill-shaped conductive contact is secured to and extends outwardly from a front end of the support body. A conductive layer of the circuit board strip connects the contact to a lead that extends outwardly from a rear end of the support body. A middle part of the support body features a series of thru-cuts that enable the support body to resiliently flex and act like a spring.

29 Claims, 7 Drawing Sheets

PROBE AND APPARATUS FOR TESTING ELECTRONIC COMPONENTS

FIELD OF THE INVENTION

The invention is in the field of equipment used for testing small electronic components. More particularly, the invention is a test probe adapted for use in equipment designed for high speed testing and sorting of small electronic components. The probe may have either a single contact portion or multiple contact portions. The contact portion(s) are designed to efficiently contact one or more terminals of an electronic component during testing. The probe includes a unique body structured to inherently provide a spring-type support for the contact portion. In the preferred embodiment, the probe is electrically connected to a test instrument such as an LCR (impedance measuring) meter.

BACKGROUND OF THE INVENTION

As electronic devices have become more common, the number of small electronic components that require testing has increased dramatically. In response to this need, automated equipment capable of testing large quantities of electronic components at exceedingly high speeds has become commonplace. For example, there is equipment of this type capable of processing electronic components at a rate of 10,000 parts per hour.

In the testing of electronic components, certain problems are commonly experienced and are often exacerbated by decreases in the size of the component to be tested. These problems have placed significant limits on the maximum component processing rate achievable by prior art units.

One such problem is that the accuracy of the test results is adversely affected when less than perfect contact occurs between the contact portion of the test probe and the component's lead. Any oxidation or other foreign or unwanted matter located on the surface of the component's terminal or on the portion of the probe designed to physically contact the terminal may produce a significant electrical resistance during testing. In an attempt to overcome this problem, it is known in the prior art to employ testing apparatus, such as the testing machine taught by Herrmann in U.S. Pat. No. 4,747,479, in which a wiping action occurs as the test probe contacts the terminal of the component. The wiping action functions to scrape off unwanted material that would interfere with testing. However, controlling the pressure used during this action is critical since the pressure must be sufficient to be effective while not being of a magnitude that will cause scratching or other damage to the terminal or to the test probe. It is difficult to maintain the pressure within these limits. It should be noted that the shape of the end of the test probe is also critical and must be taken into account when determining the allowable contact pressure. A sharp edge or point on the probe's tip can easily damage the component being tested. As a result, the flow rate of components through the prior art testing apparatus is severely limited and problems with imperfect contact between the test probe and the component's terminal still hamper accurate testing of electronic components.

To mitigate the above problems, it is known in the art to employ a spring in conjunction with the test probe. The spring is placed between the body of the test probe and a support fixture. However, the use of an added spring increases the probe's cost, maintenance and space requirements, and weight. The latter two characteristics can be of major significance when the probe is secured to a movable support and the added weight and large space requirement must be accounted for in the design of the unit.

Another problem arises when it is desired to employ multiple contact members for contacting multiple terminals on the same side of an electronic component to be tested. Since the terminals may be spaced apart from each other by less than a millimeter, it is therefore necessary for the contact members to be capable of being located in extremely close proximity to each other. This is extremely difficult to achieve with known prior art electrical probes.

SUMMARY OF THE INVENTION

The invention is a new type of test probe that can be employed in existing electronic component testing apparatus. The probe may be used for testing small electronic components such as chip resistors, chip inductors, chip arrays and chip-capacitors. Components of these types typically range in size from 0.04 to 0.12 inches in length by 0.02 to 0.06 inches in width or thickness. The probe is extremely durable and includes structure that acts like a spring and is capable of absorbing some of the impact forces that occur when the probe initially contacts the terminal of an electronic component. The probe is also relatively inexpensive to produce, requires little or no maintenance, is low in weight and has a compact size.

The probe includes a support body that has a front portion that features a conductive contact portion designed for contacting a terminal of an electronic component to be tested. The contact portion can be in the form of a conductive member or material that is located either partially within the front portion of the support body or is secured to said front portion. The probe's front portion is connected to a rear portion of the support body by an inherently flexible and resilient variable-length medial area of the support body. This allows the contact portion to move a short distance as it contacts and possibly scrapes on the terminal of the electronic component being tested. The allowed movement reduces the chances of damage occurring when the probe contacts the component.

The probe's support body is preferably in the form of at least one thin wafer member. The wafer member is structurally similar or identical to a circuit board whereby a layer of a non-conductive material is at least partially overlaid by a thin layer of conductive material. The non-conductive layer may be sandwiched between two conductive layers.

A rear portion of the support body preferably includes a lead for connecting the conductive layer of the wafer member(s) to a testing apparatus. The lead may be in the form of a wire secured to a groove in the wafer member or be an outwardly extending portion of the wafer member in which the conductive layer is exposed or otherwise accessible.

To achieve a spring action in the body of the probe, one or more thru-cuts are included in its body. The thru-cut(s) make the body less rigid and provide an area that can deform. When a force is applied to the contact portion of the probe, the support body in the area of the thru-cut(s) will flex and at least partially decrease in length as the shape of the thru-cuts changes. This enables the front portion of the probe to resiliently move a short distance in both axial and/or lateral directions. As a result, the body of the probe can absorb some of the impact forces created when the contact member first engages the electrical component to be tested. Since the portion of the support body having the thru-cut(s) acts as a spring structure and is an integral and non-separate part of the probe, the mechanical, support and guidance problems, as well as the significant space requirements associated with the use of a separate spring, are avoided. An additional advantage provided by the probe is that its flexible structure enables the contact member to easily move to adjust to irregular or non-flat terminal surfaces of each electronic component being tested.

The design of the probe also allows combining multiple, essentially identical probe structures into a single structure that then features an array of electrically-isolated contact portions. The multiple contact portions can simultaneously engage closely-spaced areas of a single electronic component or one or more areas on multiple electronic components being simultaneously tested.

The use of electrically-isolated multiple contact portions also allows a four-wire Kelvin Technique/procedure to be employed. In the procedure, a current is sent through the multiple contact portions and the component being tested. This allows the testing instrument to measure the voltage drop across the component and thereby determine the resistance through the component. As the resistance is determined, the testing instrument compensates for the lead and surface resistances.

A test probe in accordance with the invention is ideally suited for use in a test station of a machine designed to rapidly test and sort small electronic components. An example of this type of machine is found in the pending application by Utech (Ser. No. 08/293,011) which is hereby incorporated by reference. In the Utech application, the machine includes a feed station, a test station and a sorting station. A transport wheel is used to bring the components between each of the stations in a controlled and rapid manner. The test probe of the invention may be used in place of one or both of the electrical probes/contacts described in said patent application.

DETAILED DESCRIPTION OF THE DRAWINGS

Referring now to the drawings in greater detail, wherein like reference characters refer to like parts throughout the several figures, there is shown by the numeral 1 an apparatus for testing and sorting small electronic components.

Figure 1:
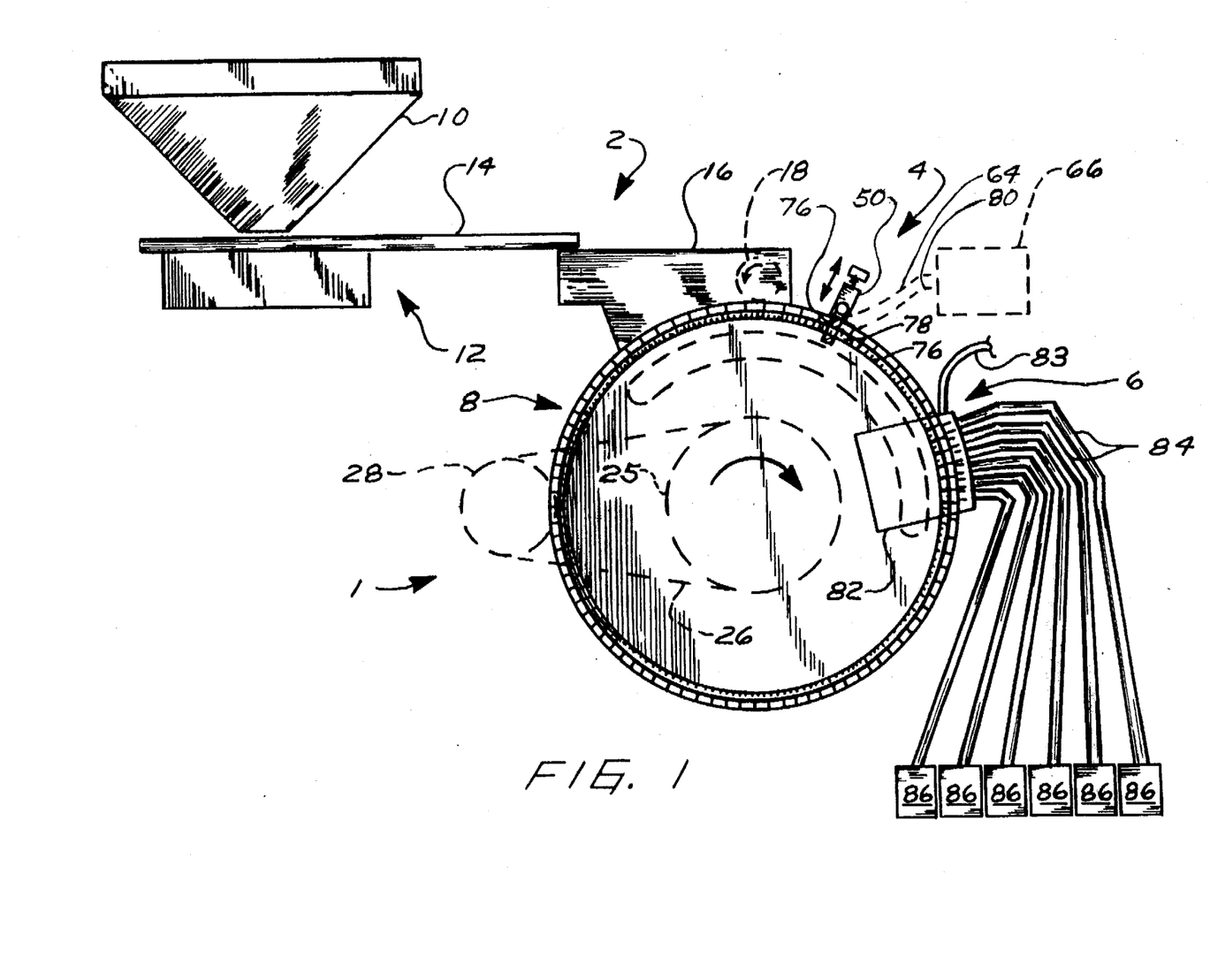
FIG. 1 is a front view of an electronic component testing and sorting apparatus that has a test station in which at least one probe in accordance with the invention is employed.

FIG. 1 provides a front view of the apparatus 1. The apparatus includes a feed station 2, a test station 4, a sorting station 6 and a transport wheel 8. In practice, each of the stations and the transport wheel are all combined in a single cabinet-type unit.

The feed station 2 includes a funnel-like hopper 10 into which small electronic components (also herein referred to as "parts") 11 such as chip resistors are inputed in bulk quantities. The hopper empties into a transfer apparatus 12 that includes a vibrating unit (not shown) that facilitates separation of the parts and their movement along ramp 14.

The ramp empties into a dispenser 16 that is designed to hold a relatively small number of the parts. Once in the dispenser, the parts may exit it through an outlet 17 formed by an opening in its bottom portion. As parts leave the dispenser, they are directly received by the transport wheel 8. It should be noted that the dispenser includes a sweeper wheel 18 that functions to prevent the parts from escaping from the end of the dispenser and also helps to maintain the parts toward the left side portion of the dispenser.

Figure 2:
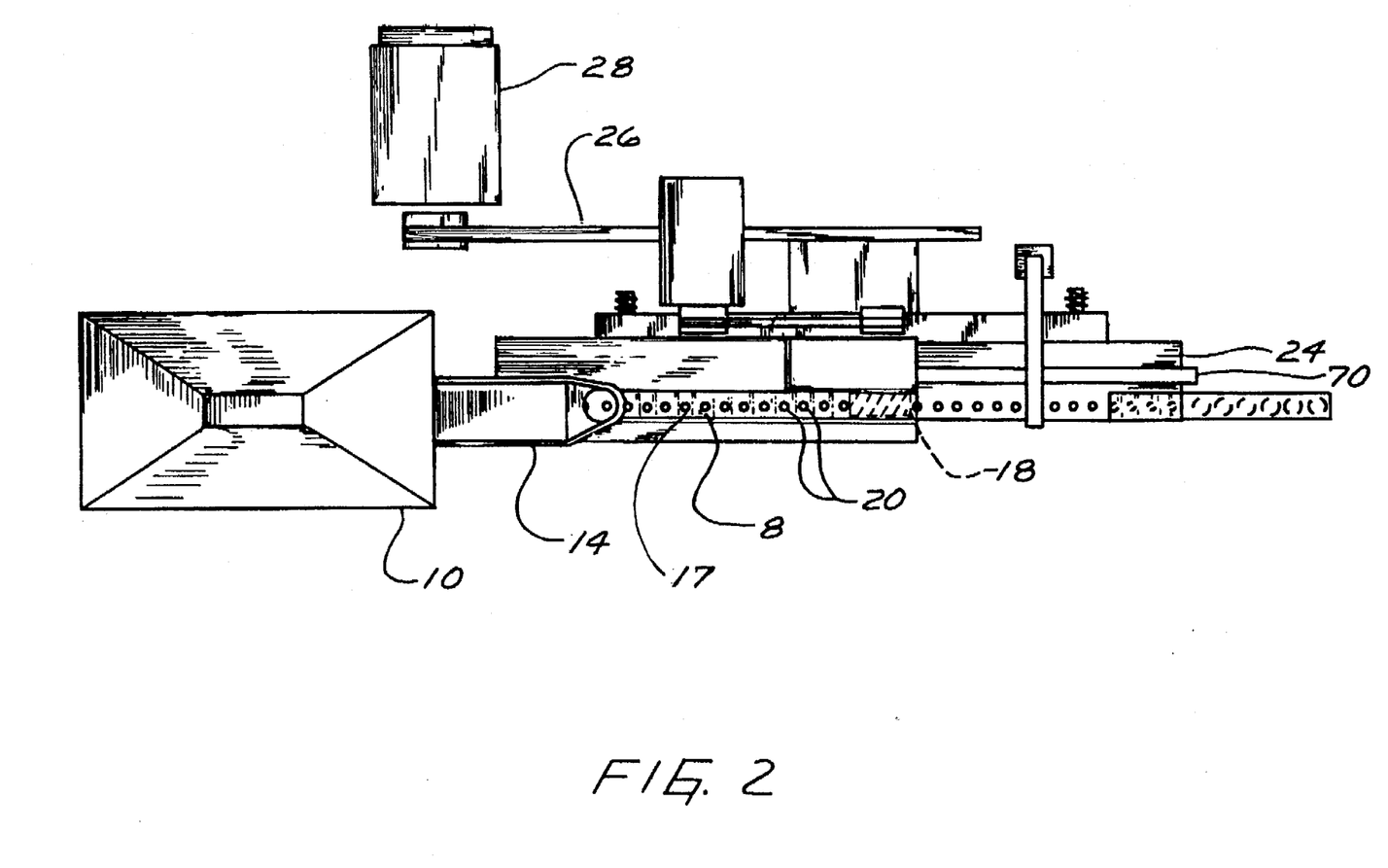
FIG. 2 is a top view of the machine shown in FIG. 1.

FIG. 2 provides a top view of the machine. In this view, the relationship between the feed station and the transport wheel may be clearly viewed. When a part leaves dispenser 16, it is received within a tubular, complementary-sized compartment 20 located on the outer rim of the transport wheel 8.

Figures 3, 4:
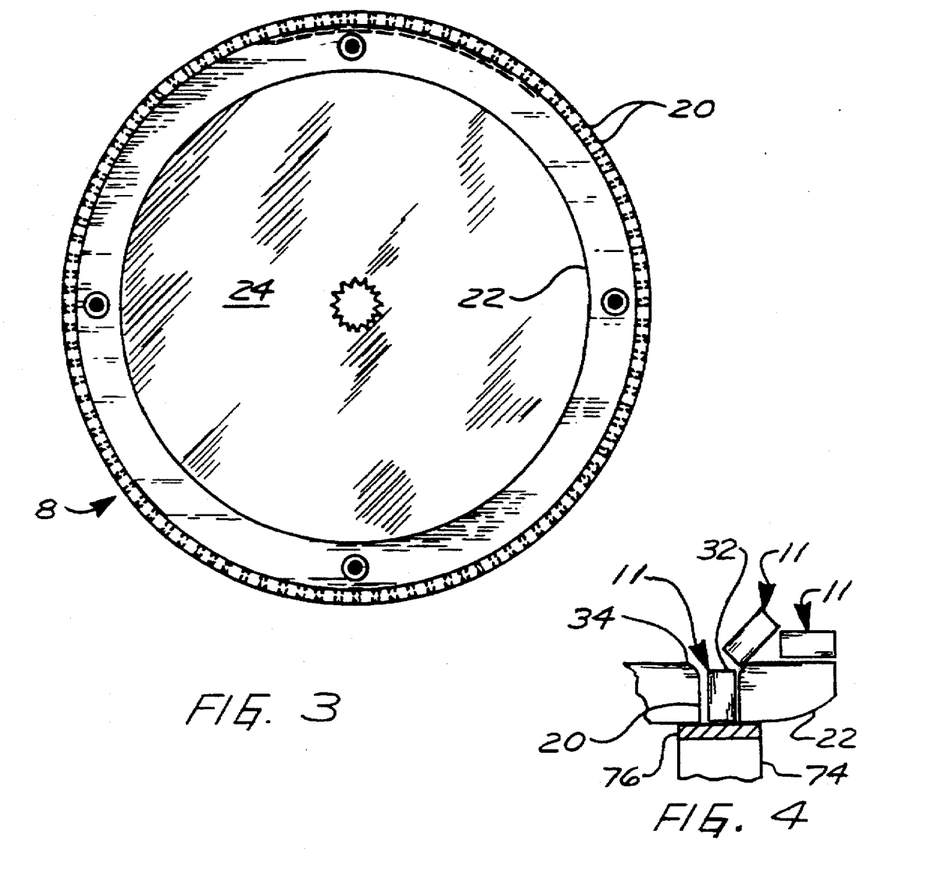
FIG. 3 is a front view of the transport wheel.
FIG. 4 is a front view, partially in cross-section, of electronic components being entered into the periphery of the transport wheel in the area of the feed station.

FIG. 3 shows a front view of the wheel 8. As can be seen in this view, there are a large number of compartments 20 in a closely-spaced pattern about the outer edge of the wheel. The compartments are located in a ring-shaped rim member 22 that forms the periphery of the wheel. In the preferred embodiment, the rim member is made of a rigid plastic material and is approximately twelve to eighteen inches in diameter. The rim member is removable from a metal hub 24 and can be replaced by other rim members that have different size compartments 20 to fit other sizes of components 11. The hub 24 has a pulley 25 (shown in FIG. 1) fixed to its rear surface that is connected by belt 26 to an electric motor 28.

FIG. 4 shows a number of electrical components 11 as they are leaving dispenser 16 and entering into the receiving compartments 20 of the wheel. In the figure, one of the parts 11 is shown at the point where it has been fully received within the compartment and has become oriented so that the top end 32 of the part is located at the top, outer portion 34 of the compartment. As the wheel rotates, each of the parts 11 will enter an empty compartment and become radially-located on the wheel with the part's longitudinal axis oriented to intersect the wheel's central axis.

Rotation of wheel 8 brings a part 11 located within one of the compartments 20 from the feed station 2 to the test station 4. Various portions of the test station are shown in FIGS. 5-9.

The test station includes a movable member in the form of an arm 50 that is connected by a pivot 52 to a stationary support member 54. A spring 56 maintains a downward bias on the arm. A test probe 60 is secured within a compartment 61 located in an outer portion of the arm. The probe is connected by a wire 64 to a testing instrument 66 such as an oscilloscope or LCR meter (note FIG. 1).

The arm 50 includes a follower member 68 that rides on a cam ring 70 (partially shown in FIGS. 5 and 6) that is attached to the back surface of hub 24 of the transport wheel 8. The cam ring includes a plurality of indentations 72 that allow the follower member and the attached arm 50 to periodically move in a up and down manner, away from or toward the center axis of the wheel 8. The cam ring effectively synchronizes the movements of the arm 50 with the rotation of the wheel so that as each part 11 is moved into the test station, arm 50 moves downwardly and a contact portion of probe 60 achieves a sliding engagement with a top, terminal end 32 of the part. It should be noted that each compartment 20 has an associated indentation on the cam ring.

Figures 5, 6:
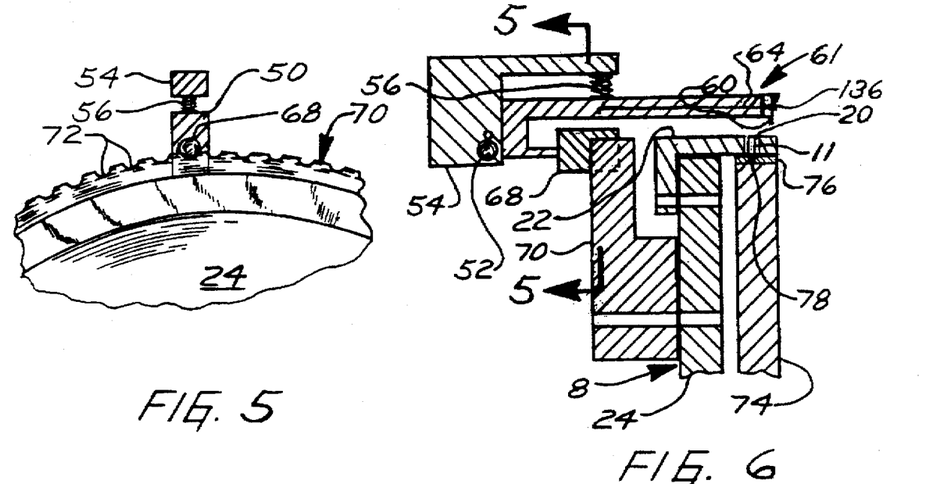
FIG. 5 is a detailed front view of the top portion of the transport wheel in the area of the test station and taken at the plane labeled 5—5 in FIG. 6.
FIG. 6 is a side, cross-sectional view of the top of the transport wheel and the test station.
Figure 7:
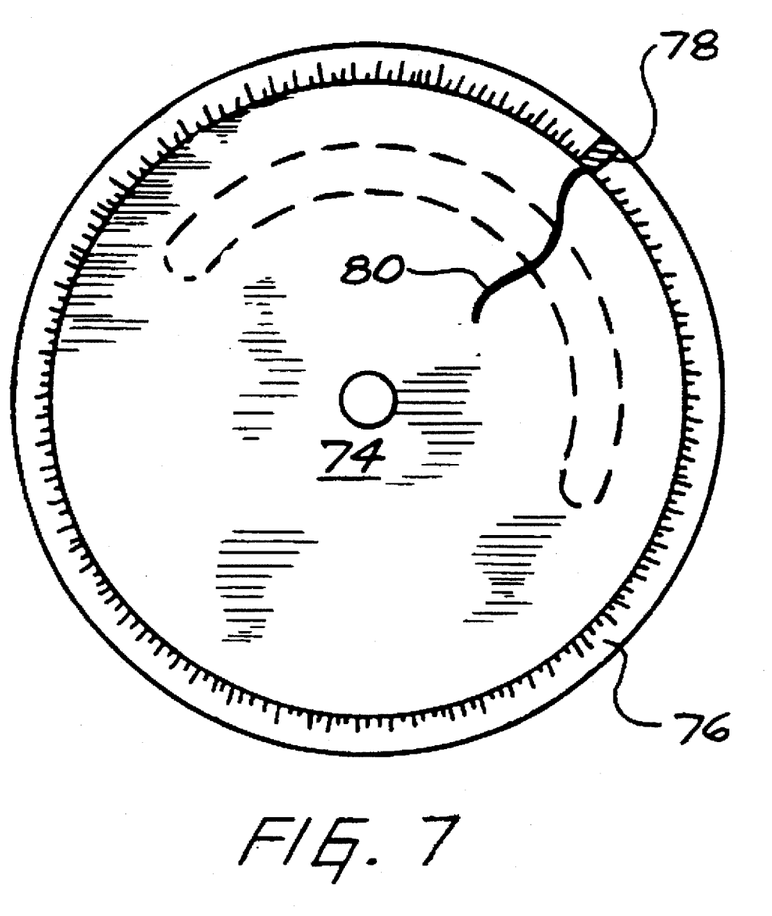
FIG. 7 provides a front view of the stationary plate that is mounted within the test wheel.

Located below the rim member 22 of the wheel is a stationary disk-like support member 74 (shown in FIGS. 6 and 7). Attached to the periphery of the member is a ring 76 of low-friction plastic material that has placed within it a test probe 78 positioned directly opposite the top probe 60. Probe 78 is connected by a wire 80 to the electrical testing apparatus 66 in the same manner as probe 60. As the wheel rotates, the bottom end of a part 11 will slide along the top surface of ring 76 until the part moves to the test station where the bottom of the part is brought into engagement with probe 78.

Figure 8:
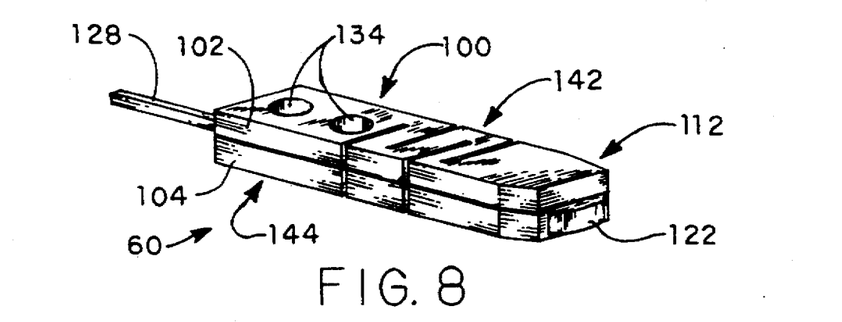
FIG. 8 provides a detailed perspective view of a test probe in accordance with the invention.
Figure 9:
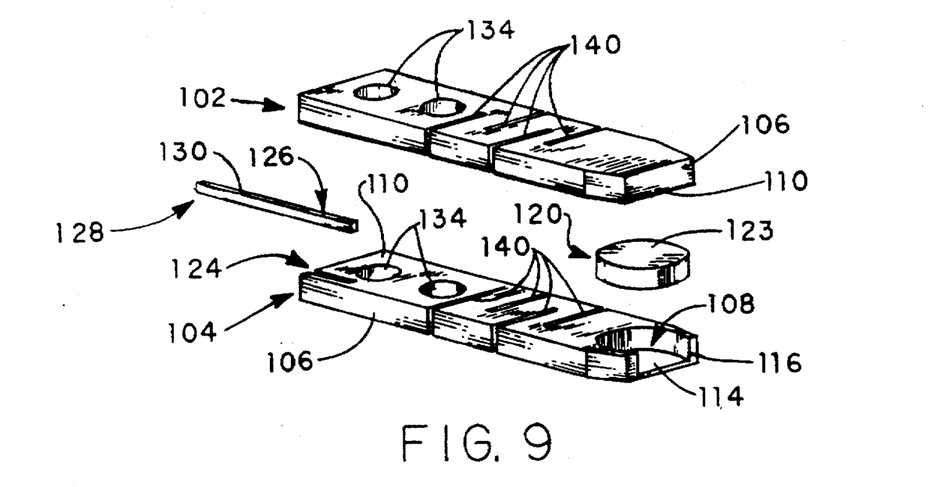
FIG. 9 is a detailed, exploded view in perspective of the test probe shown in FIG. 8.

Detailed views of a first embodiment of a test probe 60 are provided in FIGS. 8 and 9.

The probe 60 has a substantially rectangular support body 100 that includes a first wafer member 102 and a second wafer member 104. As shown, each of the two wafer members has substantially identical outer dimensions. It should be noted that wafer members having non-identical dimensions may be employed. The members are preferably made of circuit board material and include a non-conductive layer 106 made of an insulating material such as a polymer plastic material and a conductive layer 110 made of a metallic material such as copper. It should be noted that the conductive layers 110 of each of members 102 and 104 face each other.

As can be seen in FIG. 9, member 104 includes a semi-circular cavity 108 located at its distal end portion 112. The floor 114 and walls 116 of the cavity are preferably coated with a conductive material (not shown). While not shown, it is within the realm of the invention to fabricate the wafer member whereby the cavity is formed by cutting a hole in the non-conductive layer and having the floor of the cavity formed by an uncut area of the conductive layer 110.

A pill-shaped conductive member 120 is adapted for securement to the distal end of the probe 60. In the preferred embodiment, member 120 is made of a highly conductive and wear resistant material and may be additionally coated with solder. A rear portion of the member 120 is complementary in size and shape to the cavity 108 and is designed to be received within said cavity. Once received, a front portion 122 of the member will extend outwardly from the end of the wafer member 104 and thereby form the probe's contact portion. It is portion 122 that will come into direct contact with a terminal of an electronic component during testing of said component. It should be noted that while a round member 120 has been shown, other shapes may also be employed such as, but not limited to, triangles, squares, ovals, rectangles and trapezoids.

The height of the cavity 108 (the distance from the floor of the cavity to the top of the conductive layer 110) is substantially equal to the thickness of the member 120. As a result, when the member 120 is located within the cavity, the top surface 123 of member 120 will be substantially flush with the conductive layer 110 of member 104. In a similar match of complementary dimensions, the widest diameter of the cavity (measured perpendicular to the longitudinal axis of the member 104) is just slightly larger than the diameter of the member 120. When the probe is being assembled, some solder will normally flow over the sides of the member 120 to thereby secure the member in an immovable manner within the cavity.

As can be seen in FIG. 9, member 104 also includes a rear-located groove 124. The groove is adapted to inwardly receive an end portion 126 of a conductive wire or lead 128 used to connect the probe to a testing apparatus. When the wire 128 is received within the groove, the top surface 130 of wire portion 126 will preferably be flush with the conductive layer 110 of member 104.

To assemble the probe 60, the conductive member 120 is placed into cavity 108 and the wire portion 126 is placed into the groove 124. The two wafer members 102 and 104 are then placed together as shown with their conductive surfaces 110 facing each other. In the preferred embodiment, a coating of solder paste or solid solder (not shown) is placed onto the surface of the conductive layer 110 of member 102 and/or 104 to improve contact between it and the member 120, wire portion 126 and the conductive layer 110 of the opposing wafer member. It should be noted that in the assembled unit, the conductive layer 110 of the wafer member 102 will thereby contact the top surface of both the pill-shaped member 120 and the top surface 130 of the wire portion 126. When solid solder is used between the conductive layers 110, heat is applied during or after assembly to melt the solder.

After the unit has been assembled, fasteners such as rivets or screws (not shown) can be positioned to extend through the apertures 134 in each wafer member to thereby secure together the two members 102 and 104. Alternatively, the apertures 134 can be employed when securing the probe to a testing apparatus whereby pins 136 (note FIG. 6) that are removably secured to the testing apparatus fit through the apertures 134 to secure the probe to the apparatus. The pins 136 also function to align the probe so that its contact portion will be properly positioned.

As shown in the figures, each of the wafer members 102 and 104 includes a plurality of spaced thru-cuts 140 that extend completely through the associated member. A thru-cut is hereby defined as an opening that extends through a body. A thru-cut can be in the form of a slot having an open end and a closed end, as shown in FIGS. 8 and 9, or it can even be an aperture (note FIG. 24) that extends through the body and does not have a side-located opening.

When the two members 102 and 104 are assembled, the thru-cuts 140 become aligned and extend completely through the body 100 of the probe. In an alternate manner of construction, the cuts 140 can be made in the body of the probe after the two members 102 and 104 have been assembled.

Figure 10:
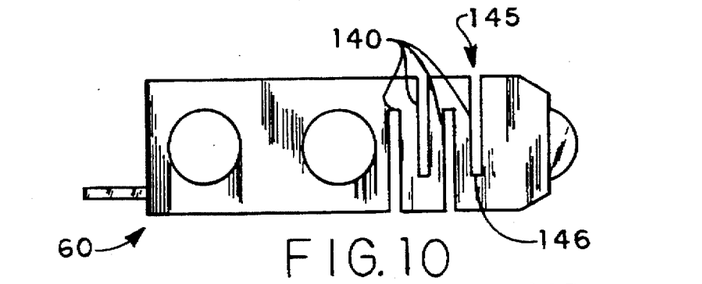
FIG. 10 is a plan view of the test probe shown in FIG. 8.
Figure 11:
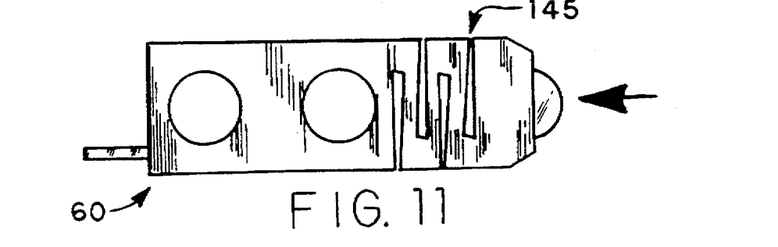
FIG. 11 is a plan view of the test probe shown in FIG. 8 in an axially-compressed condition.

The thru-cuts 140 cause the medial portion 142 of the probe's body 100 to assume a serpentine shape. This shape reduces the rigidity of the medial portion 142 of the support body and enables said portion to be resiliently compressed and to flex just like a spring. In this manner, the distal end portion 112 of the probe's body can move relative to the probe's rear portion 144. This is shown in FIGS. 10 and 11. One should note that the rectangular shape of the cuts changes/deforms as the size of the open end 145 of each cut decreases as the contact member moves axially inwards. It should also be noted that the closed end 146 of each cut may have an enlarged rounded surface or other shape that functions to reduce stress and prevent the cut from inadvertently spreading within the associated wafer member.

As an example of a probe in accordance with the invention, a probe similar to that shown in FIG. 8 and having only two thru-cuts 140 was fabricated using wafer members made of circuit board material. The probe was approximately 25 mm long, 6 mm wide, 0.7 mm thick and each thru-cut 140 was 0.8 mm in width and 5.4 mm long. With the probe's rear portion 144 held stationary, the distal end 112 of the probe could be moved axially, in a resilient manner, a distance of approximately 0.8 mm without any resultant damage to the body of the probe.

While four thru-cuts 140 are shown in the body of the probe, one can employ a fewer or greater number of thru-cuts depending on the required strength of the probe and the desired amount of resiliency or flexibility it will display. In addition, other shapes or patterns of cuts may be employed to achieve the desired spring action. Even non-linear cuts, such as 'L'-shaped cuts, can be employed.

Figure 12:
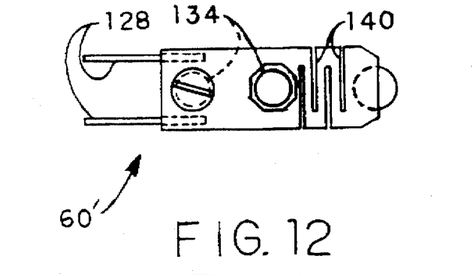
FIG. 12 is a plan view of a second embodiment of a test probe in accordance with the invention.
Figure 13:
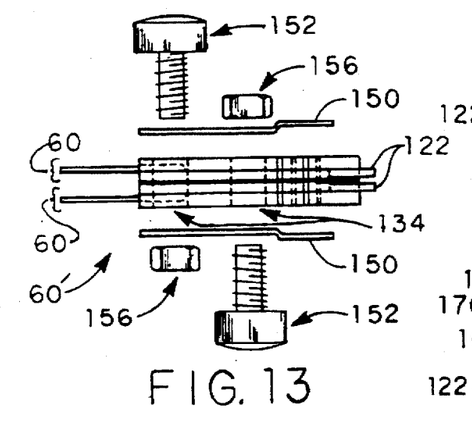
FIG. 13 is a side view of the test probe shown in FIG. 12 with said probe shown in a partially disassembled condition.

FIGS. 12 and 13 show a second embodiment of a probe 60' in accordance with the invention. As shown, the probe is basically two probes 60 that have been joined together to thereby provide a probe having a pair of closely-spaced contact portions 122 for engaging closely-spaced terminals of an electronic component to be tested. Unlike the prior embodiment, a pair of casing halves 150 are placed above and below the top and bottom surfaces of the probes. Each casing half features an upturned forward portion to eliminate any frictional engagement between itself and the movable contact portion of the probe.

Optional removable screws 152 extend through the probe's apertures 134 and are threadedly engaged to complementary nuts 156. While the probe 60' is shown as a composite of two probes 60, it should be noted that the design of the probe allows for any number of probes 60 to be combined. For example, three or four probes 60 can be stacked together and then assembled into a single probe using the casing halves shown and longer fasteners 152. It should be noted from the figures that one can orient the probes 60 whereby the probe's leads 128 are located on opposite sides. The resultant spacing of the leads facilitates connection of the probe to a testing instrument.

In the above embodiment, the casing halves 150 function to secure together two probes 60 to form a single probe 60'. The casing halves may include side portions (not shown) that wrap about the sides of the probe's body portion when it is desirable to eliminate all possibility of lateral movement of the probe's contact portion(s).

Figure 14:
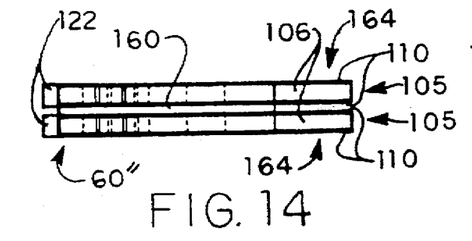
FIG. 14 is a side view of a third embodiment of a test probe in accordance with the invention.
Figure 15:
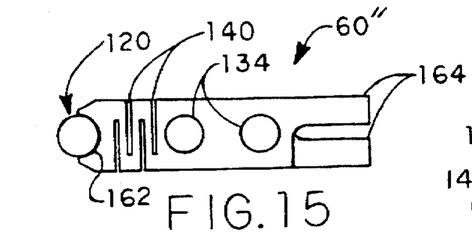
FIG. 15 is a plan view of the test probe shown in FIG. 14.

FIGS. 14 and 15 show a third embodiment of a probe 60" in accordance with the invention. In this embodiment, two wafer members 105 sandwich a thin layer of a flexible insulating material 160. Layer 160 preferably has both of its top and bottom faces coated with an adhesive material.

Wafer member 105 is basically identical to wafer member 102 except that its cavity for receiving the pill-shaped conductive member 120 is in the form of a semi-circular notch 162. Member 105 has top and bottom-located planar conductive layers 110 that sandwich the planar non-conductive layer 106. It should be noted that member 105 may employ only a single layer of conductive material 110 in the same manner as shown for wafer member 102.

The notch 162 extends between the top and bottom surfaces of the member 105 and forms a semi-circular cavity. The notch's sidewalls are preferably coated with a conductive material. As shown, the pill-shaped conductive member 120 is partially received within the notch and is preferably secured therein with solder. The solder electrically connects the member 120 to the conductive layer(s) 110 of the wafer member. It should be noted that in this embodiment, each of the probe's two leads 164 is formed from a narrow portion of the wafer member 105 that extends outwardly from the rear of the probe.

As can be seen in the figures, the probe 60" is extremely compact and has two contact portions 122 that are very closely spaced. The separation distance between the contact portions is substantially equal to the thickness of layer 160. Each contact portion may be moved axially by virtue of the deformable thru-cuts 140 as described in the previous embodiments.

Figure 16:
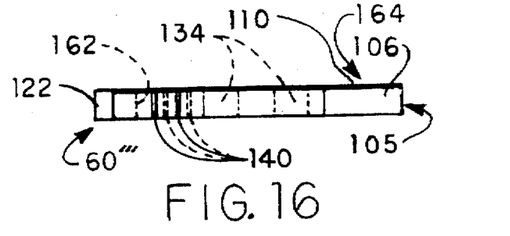
FIG. 16 is a side view of a fourth embodiment of a test probe in accordance with the invention.

FIG. 16 provides a side view of a fourth embodiment of a probe 60'" in accordance with the invention. This embodiment is essentially identical to the previously described embodiment except that only one wafer member 105 having a single conductive layer 110 is employed to provide a single contact portion 122. This probe embodiment is extremely simple and compact. While not shown, the wafer member 105 may include both top and bottom located conductive layers 110.

Figure 17:
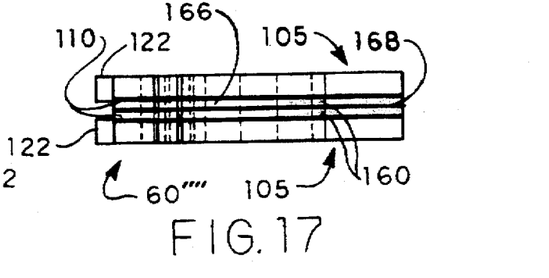
FIG. 17 is a side view of a fifth embodiment of a test probe in accordance with the invention.

FIG. 17 shows a fifth embodiment of a probe 60"" in accordance with the invention. In this embodiment, the probe includes top and bottom-located wafer members 105. Located between the wafer members are two thin layers of insulating material 160. Sandwiched between the layers 160 is a planar sheet 166 of conductive material that includes an outwardly extending lead portion 168. Once the lead portion of sheet 166 is connected to ground, it will function to electrically shield the two members 105 from each other and thereby prevent the electrical signals carried by one from interfering with the electrical signals carried by the other.

Figure 18:
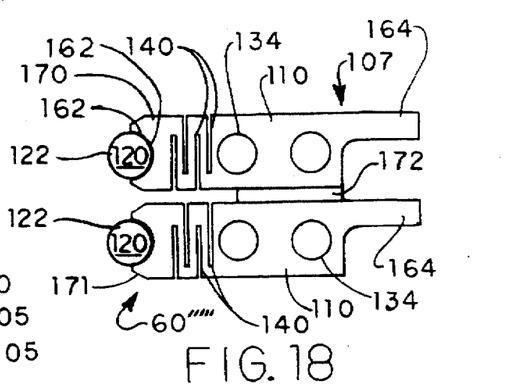
FIG. 18 is a plan view of a sixth embodiment of a test probe in accordance with the invention.

FIG. 18 shows a sixth embodiment of a probe 60""' in accordance with the invention. In this embodiment, the probe is made up of one large wafer member 107 that is identical in composition to wafer member 105. Two conductive members 120 are secured to the wafer member in the same manner as taught for the previous embodiments.

The wafer member 107 has first and second side portions, 170 and 171 respectively. The two side portions are connected together by a non-conductive area 172 fashioned by removing the conductive layer(s) 110 from area 172. As shown, each side portion includes a contact portion 122 that is connected by layer(s) 110 to a lead 164 in the same manner as employed in wafer member 105. To enable each contact portion to move in an axial or transverse direction, a series of thru-cuts 140 is located just behind each contact portion. It should be noted that each of the two shown contact portions can move a short distance (as allowed by their respective thru-cuts 140) independently of the other contact portion. It should also be noted that while a probe having two contact portions is shown, the probe can instead be made with three or more contact portions by merely repeating the same basic structure (typified by a single wafer member 105) to either side of the structure shown.

Figure 19:
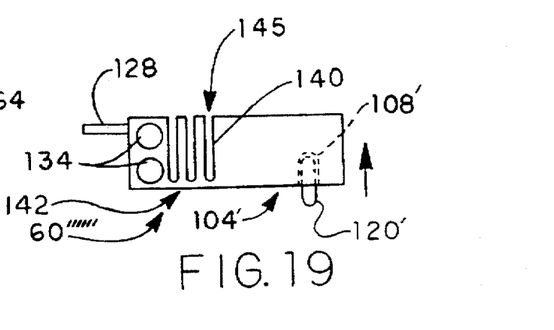
FIG. 19 is a plan view of a seventh embodiment of a test probe in accordance with the invention.

FIG. 19 shows a seventh embodiment of a probe 60'''' in accordance with the invention. In this embodiment, the probe is a composite of wafer members 102 and 104' and is similar to probe 60. Wafer member 104' is essentially identical to wafer member 104 with the exception that the cavity 108' in member 104' has a side-located opening. The contact member 120' extends through said opening. It should be noted that the body of the probe includes a plurality of thru-cuts 140 that are oriented with their open ends 145 all on the same side of the support body. The thru-cuts enable the contact member to move in a direction perpendicular to the longitudinal axis of the probe. As the contact member moves in the direction indicated by the arrow in the drawing figure, the open end 145 of each thru-cut will narrow and thereby cause the top portion of the support body's medial portion 142 to decrease in length. Once an upward force is no longer being applied to the contact member, the support body will then act as a spring and resiliently return the contact member to its original position.

Figures 20, 21, 22, 23:
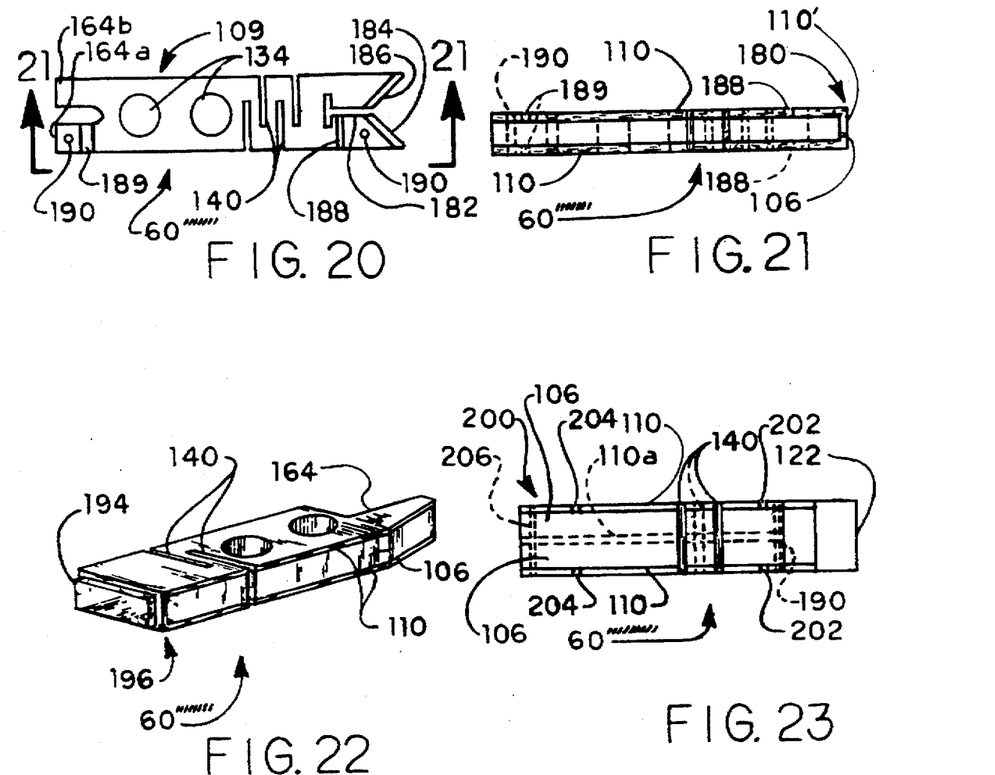
FIG. 20 is a plan view of an eighth embodiment of a test probe in accordance with the invention.
FIG. 21 is a side view of the probe shown in FIG. 20.
FIG. 22 is a perspective view of a ninth embodiment of a test probe in accordance with the invention.
FIG. 23 is a side view of a tenth embodiment of a test probe in accordance with the invention.

FIGS. 20 and 21 show an eighth embodiment of a probe 60''''' in accordance with the invention. In this embodiment, the probe is in the form of a wafer member 109 that features a non-conductive layer 106 sandwiched between conductive layers 110. The contact portion 180 of the probe is made by placing a conductive layer 110' about the front end of the probe whereby it connects to both of the top and bottom conductive layers 110. A 'T'-shaped slot 182 extends through the center of the 'V'-shaped contact portion of the probe to enable the two side portions 184, 186 of portion 180 to move somewhat independently. As shown, the distal end of side portion 184 is not connected to the major portion of the top conductive layer 110 by virtue of a discontinuity 188 in said top layer. A similar discontinuity (not shown) is located on the bottom surface of portion 186 to thereby electrically isolate the distal end of said side portion from the major portion of the bottom conductive layer 110. As shown, the probe includes a plurality of thru-cuts 140 that, in combination with the slot 182, enable some axial and transverse movement of the two side portions of the probe's contact portion.

Located at the rear end of the probe are two leads, 164a and 164b. As can be seen, the conductive layer that forms the top surface of lead 164a includes a discontinuity 189 that functions to electrically isolate the distal end of the associated lead from the major portion of the top conductive layer 110. A thru-bore 190 extends through the lead 164a and has its sidewalls coated with an electrically conductive material that functions to electrically connect the top and bottom layers 110 of lead 164a. In this manner, the distal end of lead 164a is only electrically connected to side portion 184 of the probe's contact portion. The bottom conductive layer of lead 164b also includes a discontinuity 189 so that the lead is only electrically connected to side portion 186 of the probe's contact portion. In this manner, the probe can be simultaneously connected to two separate terminals of an electronic component with each terminal being electrically-connected to only one of the probe's leads.

FIG. 22 shows a perspective view of a ninth embodiment of a probe 60''''' in accordance with the invention. In this embodiment, the probe's support body is a wafer member that is structurally similar to wafer member 109 and is formed by sandwiching a layer of non-conductive material 106 between top and bottom layers 110 of conductive material. A block 194 of conductive and wear resistant material is preferably adhered to the end 196 of the wafer member and forms the contact portion of the probe. Block 194 is connected to the probe's lead portion 164 by the top and bottom conductive layers 110. While the block 194 and end 196 of the wafer member are shown having a rectangular shape, the contact portion of the probe may be configured to have a concave, convex, or other shaped surface.

As in the previous embodiments, a series of thru-cuts 140 extend through the body of the probe. The cuts allow the medial portion of said body to act like a spring and allow axial and transverse movement of the probe's end 196 relative to the probe's other end.

Figure 24:
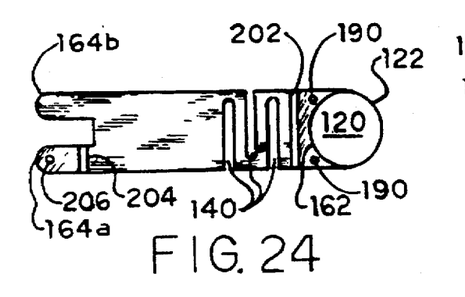
FIG. 24 is a plan view of the probe shown in FIG. 23.

FIGS. 23 and 24 show a tenth embodiment of a probe 60'''''' in accordance with the invention. In this embodiment, the probe is made up of a wafer member 200 that includes top and bottom planar layers 110 of conductive material and two interior planar layers of non-conductive material 106. The layers 106 are separated by another planar layer 110a of conductive material. As shown, the front of the probe includes a notch 162 into which is partially received the pill-shaped conductive member 120. The walls of the notch are coated with a conductive material such as solder and solder is preferably used to secure the member 120 to the notch. The top and bottom layers 110 each contain discontinuities 202 that function to electrically-isolate the front portion of each layer from the major, rear portion of each layer. Two conductive thru-bores 190 are employed to connect together the conductive layer 110a and the top and bottom minor front-located portions of the conductive layers 110.

The top and bottom conductive layers of lead 164a also include discontinuities 204 that function to electrically isolate the distal end of the associated lead from the major portion of each of the top and bottom layers 110. A thru-bore 206 extends through the lead 164a and has its sidewalls coated with an electrically conductive material that functions to electrically connect the interior conductive layer 110a to the top and bottom layers 110 of lead 164a. In this manner, the contact portion 122 is only connected to lead 164a. Lead 164b provides a connection to the major portions of the top and bottom conductive layers 110. When lead 164b is connected to a ground, the major portions of the top and bottom conductive layers 110 will then function as a conductive sheath that shields the internal layer 110a from external electrical signals. It should be noted that the use of a conductive sheath structure such as that shown in the figure or other equivalent conductive sheath-like structures can be employed with any of the other embodiments of the invention.

Figure 25:
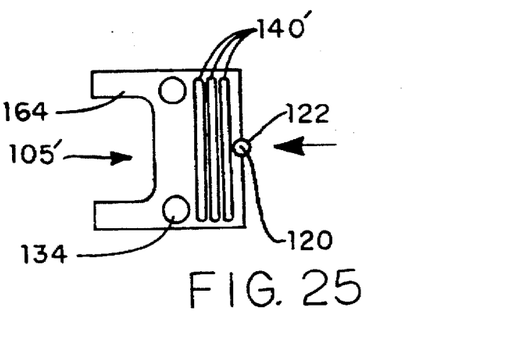
FIG. 25 is a plan view of an eleventh embodiment of a test probe in accordance with the invention.

FIG. 25 is a plan view of an eleventh embodiment of a test probe 60''''''' in accordance with the invention. This embodiment is structurally similar to the embodiment shown in FIG. 16 and has a non-conductive layer sandwiched between conductive layers. Compared to the FIG. 16 embodiment, the wafer member 105' is much wider and the thru-cuts 140' are in the form of a series of apertures in lieu of slots. The apertures extend completely through the support body (wafer member 105'). When the contact member is moved in the direction shown by the arrow in the figure, the width of the center portion of each aperture will narrow. Once force is no longer being applied to the end of the contact member, the resiliency of the materials forming the support body (wafer member 105') will cause the contact member and the thru-cuts to again assume the position/shape shown in the figure. It should be noted that when the contact portion 122 is moved in the direction of the arrow, this movement is perpendicular to the longitudinal axis of the support body.

The bottom probe 78 may be in the form of a simple conductive member embedded in the non-conductive material located on the perimeter of disk 74. Alternatively, the bottom probe may employ some or all of the structural attributes of the probes shown in FIGS. 8–25 and be fitted into a complementary recess (not shown) in the disk 74.

The upper and lower probes, 60 and 78 respectively, act together to temporarily connect part 11 to the testing instrument 66. After the part has been tested, the wheel rotates to bring the next part 11 into the test station and the tested component into the sorting station 6.

The sorting station includes a block 82 that houses a series of electrically-operated solenoid valves (not shown). Each valve is connected to a source 83 of pressurized air and is located so that it points to one of the compartments 20 facing the block. Aligned with the compartments and the valves are a plurality of tubes 84 with each tube being specific to one of the compartments 20 and extending to its own dedicated part-receiving bin 86.

After a part 11 has been tested at the test station, its test results are temporarily stored by the testing instrument. The testing instrument is connected to the solenoid valves so that, based on the test results determined at the test station, when a part 11 reaches an appropriate position, it will be aligned with a particular one of the valves. The valve is caused to open by the test instrument and pressurized air is then directed from the valve into the compartment 20 that is adjacent to the valve. This forces the part 11 to be pushed into the adjacent tube 84 and then into the appropriate receiving bin 86.

While the probe 60 (and the other embodiments of the probe taught herein) has been taught as being used within the test station of the testing and sorting machine described herein, it should be noted that the probe may be employed in various other types of machines or environments in which an electrical probe is employed. It should also be noted that the casing structure taught in the second embodiment of the invention can be employed with all of the other embodiments of the invention. While an area employing thru-cuts 140 in the material of the support body has been taught for flexibly connecting together the two ends of the probe, one can also create a flexible area in a more complicated manner by securing a dissimilar material such as a resilient conductive or non-conductive material in a suitable gap/thru-cut in the support body.

The embodiments disclosed herein have been discussed for the purpose of familiarizing the reader with the novel aspects of the invention. Although preferred embodiments of the invention have been shown and described, many changes, modifications and substitutions may be made by one having ordinary skill in the art without necessarily departing from the spirit and scope of the invention as described in the following claims.

I claim:

1. A probe capable of being used in the testing of electronic components, wherein said probe can be operatively connected to a testing instrument, said probe comprising:

a support body having a flex means located between first and second portions of said body, wherein said flex means has at least a portion that is serpentine in shape and variable in length, wherein said flex means resiliently secures said first portion to said second portion, and wherein said flex means provides a spring action that is thereby inherent in the structure of the support body;

an electrically-conductive contact means secured to the first portion of said support body and capable of contacting a terminal of an electrical component when said component is being tested; and an electrical connecting means for connecting the contact means to a testing instrument.

2. The probe of claim 1 wherein the support body partially surrounds the contact means.

3. The probe of claim 1 wherein the contact means is in the form of a shaped member that is partially received within complementary-shaped cavity in the support body.

4. The probe of claim 3 wherein at least a portion of the contact means extends outwardly from the support body.

5. The probe of claim 1 wherein the support body includes first and second wafer members that partially sandwich the contact means.

6. The probe of claim 1 wherein said probe includes at least two contact means, wherein the electrical connecting means includes a first portion connected to a first one of said contact means and a second portion connected to a second one of said contact means, and wherein said first and second contact means are electrically-isolated from each other.

7. The probe of claim 6 wherein said first and second contact means are linearly aligned with each other.

8. The probe of claim 6 further comprising a conductive shield means located between the first and second portions of the electrical connecting means, wherein said conductive shield means functions to prevent electrical signals passing through one of said portions of the electrical connecting means from interfering with electrical signals passing through the other of said portions of the electrical connecting means.

9. The probe of claim 1 wherein the flex means is in the form of a medial portion of the support body that includes at least one thru-cut whereby when the first portion of the support body is urged toward the second portion of the support body, a portion of the body will flex and portions of opposite sidewalls of said thru-cut will move closer together.

10. The probe of claim 1 wherein the support body includes at least one wafer member and wherein said flex means comprises a thru-cut located in said at least one wafer member and wherein when a force greater than a predetermined threshold force is applied to a distal end of the contact means, a portion of the at least one wafer member will flex and thereby allow a portion of an open area located between opposite sidewalls of said thru-cut to narrow and thereby enable the contact means to move toward the second portion of the support body.

11. The probe of claim 10 wherein said at least one wafer member includes a layer of non-conductive material and a layer of conductive material.

12. The probe of claim 11 wherein the support body includes first and second wafer members oriented whereby their respective conductive layers face each other.

13. The probe of claim 12 wherein the first wafer member includes a cavity sized and shaped to inwardly receive a portion of the contact means and wherein a portion of the conductive layer of the second wafer member overlies a portion of the contact means.

14. The probe of claim 10 wherein a conductive lead means extends outwardly from the second portion of the support body and forms a portion of the electrical connecting means.

15. The probe of claim 14 wherein said at least one wafer member includes a conductive layer that is in electrical contact with the lead means.

16. The probe of claim 10 wherein said at least one wafer member has a cross-section substantially identical to that of a conventional circuit board.

17. The probe of claim 1 wherein the flex means allows the contact means to move in at least a first direction, and wherein the flex means is in the form of at least one thru-cut that extends through the support body and has at least a portion that is non-parallel to said first direction.

18. The probe of claim 1 wherein the support body includes first and second wafer members that are planar in shape and partially sandwich the contact means.

19. The probe of claim 1 wherein the support body includes at least one thru-hole capable of receiving a fastener means for securing together multiple portions of said support body.

20. The probe of claim 1 wherein the flex means is in the form of a medial portion of the support body that includes at least one thru-cut that defines an open area having a predetermined shape, and wherein when the first portion of the support body is urged toward the second portion of the support body, a portion of the support body will flex and the shape of the open area will change.

21. The probe of claim 1 wherein the flex means is in the form of a medial portion of the support body that includes at least one thru-cut that is in the form of an aperture that extends completely through the support body and has a first shape when the contact means is in a first position and wherein when said contact means is moved to a second position, said at least one thru-cut will be deformed and will assume a second shape that is different from said first shape.

22. The probe of claim 1 wherein the contact means is in the form of a sheet of conductive material.

23. The probe of claim 1 further comprising a conductive shield means that functions to shield a portion of the electrical connecting means from external electrical signals.

24. A probe used in the testing of electronic components, said probe comprising:
    a support body having a first end portion, a second end portion and a semi-flexible medial portion located between said first and second end portions;
    an electrically-conductive contact means secured to the first end portion of the support body and capable of contacting a terminal of an electronic component;
    an electrical connecting means capable of connecting the contact means to a testing instrument; and
    wherein the medial portion of the support body has a serpentine shape and includes at least one thru-cut that functions to allow the support body's first end portion to resiliently move relative to the support body's second end portion.

25. The probe of claim 24 wherein the support body includes at least one wafer member that has a substantially planar non-conductive layer secured to a substantially planar conductive layer.

26. A device for testing electrical components, said device comprising:
    a feed station adapted to receive bulk quantities of electrical components and dispense said components through an outlet;
    a transport means, said transport means having a plurality of separate, spaced-apart compartments adapted to receive electrical components from the outlet of the feed station;
    a test station that includes a fixed first probe and a movable second probe and wherein when an electrical component is located within the test station, the first and second probes will automatically contact the component and wherein at least one of said probes includes a support body that has a resilient flex means in the form of a serpentine portion of said support body, wherein said serpentine portion includes at least one thru-cut whose shape changes when a contact means secured to a first portion of the associated probe is moved relative to a second portion of the associated probe and wherein said flex means functions as a spring;
    testing apparatus operatively connected to the first and second probes of the test station; and
    wherein when an electrical component is located in one of the compartments of the transport means, it can be transported from the feed station to the test station.

27. The device of claim 26 wherein the support body of one of the probes of the test station includes at least one wafer member that is made of a circuit board material, wherein at least one thru-cut extends through said support body, and wherein when a force that is greater than a predetermined threshold force is applied to the contact means of the associated probe, a portion of an open area at least partially surrounded by said at least one thru-cut will be caused to narrow.

28. The device of claim 26 wherein the test station includes a movable member to which is secured the second probe, wherein the second probe includes said flex means, and wherein the support body of said second probe includes an engagement means designed to engage a securement means carried by the movable member to thereby secure the second probe to said movable member.

29. The device of claim 28 wherein the engagement means is in the form of at least one thru-hole in the second probe's support body and the securement means is in the form of at least one pin means secured to said movable member and adapted to at least partially fit through said at least one thru-hole.

\* \* \* \* \*